United States Patent [19]

Smith

[11] 4,445,063

[45] Apr. 24, 1984

[54] ENERGIZING CIRCUIT FOR ULTRASONIC TRANSDUCER

[75] Inventor: Robert J. Smith, Lynnwood, Wash.

[73] Assignee: Solid State Systems, Corporation, Lynnwood, Wash.

[21] Appl. No.: 401,914

[22] Filed: Jul. 26, 1982

[51] Int. Cl.[3] .......... H01L 41/08

[52] U.S. Cl. .......... 310/316; 331/154

[58] Field of Search .......... 310/316–318; 318/116–118; 331/1 R, 18, 25, 64, 154, 158

[56] References Cited

U.S. PATENT DOCUMENTS

| | | | |
|---|---|---|---|
| 3,152,295 | 10/1964 | Schebler | 310/316 X |
| 3,432,691 | 3/1969 | Shoh | 310/316 |
| 3,842,340 | 10/1974 | Brandquist | 310/316 X |
| 4,056,761 | 11/1977 | Jacoby et al. | 310/317 X |
| 4,168,447 | 9/1979 | Bussiere et al. | 310/316 |
| 4,184,092 | 1/1980 | Wieser | 310/316 |
| 4,271,371 | 6/1981 | Furuichi et al. | 310/316 |
| 4,277,758 | 7/1981 | Mishiro | 310/316 X |

*Primary Examiner*—Mark O. Budd
*Attorney, Agent, or Firm*—Christensen, O'Connor, Johnson & Kindness

[57] ABSTRACT

An energizing circuit (10) for automatically driving a piezoelectric crystal transducer (Y1) at its resonant frequency includes a resonant circuit (12) of which the transducer (Y1) forms a capacitive element and the secondary winding (80) of a transformer (T2) forms an inductive element. In addition, the piezoelectric crystal itself acts as a series RLC circuit disposed in parallel with the parallel capacitive and inductive elements of the resonant circuit (12). Secondary winding (80) is inductively coupled with a primary winding (74) of the transformer (T2) which forms part of a driving circuit (14). The driving circuit (14) includes a switching circuit (20) connected between a power supply circuit (16) and the resonant circuit (12). Driving circuit (14) also includes a control circuit (28) which senses the difference between the vibrational frequency of transducer (Y1) and its resonant frequency and produces an appropriate level control signal which is transmitted to an oscillatory circuit (24) which in turn produces a switching signal of the desired frequency to actuate the switching circuit (20) at the proper rate to drive resonant circuit (12) at the resonant frequency of transducer (Y1) through the inductive coupling formed by transformer (T2).

19 Claims, 2 Drawing Figures

ENERGIZING CIRCUIT FOR ULTRASONIC TRANSDUCER

DESCRIPTION

1. Technical Field

The present invention relates to ultrasonic systems, and more particularly to an oscillatory circuit for automatically driving an ultrasonic transducer at its resonant frequency.

2. Background Art

Ultrasonic devices, such as dental scalers used to remove plaque from teeth or a cleaning apparatus used to clean jewelry crystal, commonly include piezoelectric transducer elements to convert high frequency electrical energy into ultrasonic frequency mechanical vibrations which are applied to a work tool, such as a dental scaler tip, or to the tank of a cleaning apparatus. The piezoelectric transducer crystals are typically either disc or tubular-shaped. The transducers are energized by an electrical driving circuit which supplies an ultrasonic frequency electrical signal to the transducer. Electrical circuits for driving piezoelectric crystal transducers are disclosed by U.S. Pat. Nos. 3,432,691; 3,596,206; 3,651,352; 3,809,977; 3,924,335; and 4,168,447.

One common type of electrical circuit for driving an ultrasonic transducer is known as an Armstrong-type oscillating circuit which includes a direct current (hereafter "DC") power supply which is transmitted through a switching device to the primary winding of a step-up transformer. The switching device is typically composed of a power transistor or other type of high speed switch to supply a high frequency electrical signal to the transformer primary winding. A secondary winding of the transformer is connected in parallel with the piezoelectric transducer. Layers of silver oxide or other types of compounds are deposited or otherwise applied to opposite surfaces of the piezoelectric crystal to form electrodes. In disc-shaped crystals, the electrodes are formed on opposite faces of the disc. In tubular-shaped crystals, the electrodes are formed on the outside and inside cylindrical surfaces of the crystal.

The piezoelectric transducer behaves as a capacitor, with the crystal serving as a dielectric, which electrically insulates the two electrodes from each other. The transducer, the capacitive element, and the secondary winding of the transformer, the inductive element, are sized together to form a resonant or tank circuit which generates a decaying alternating current at the resonant frequency of the transducer when energized by the electrical pulses from the transistor switching device. The alternating signal formed by the resonating tank circuit is induced on a feedback winding which is inductively coupled with the transformer primary winding. The feedback signal generated by the feedback winding is transmitted to the base of the switching transistor to actuate the transistor at the resonant frequency of the tank circuit Which in theory corresponds to the resonant frequency of the transducer. The transducer most efficiently converts electrical energy into mechanical vibrations when driven at its resonant frequency since at resonance, the impedance of the tank circuit is at a minimum. If the transducer is not driven at its resonant frequency, the power produced by the transducer diminishes causing a corresponding increase in heat generated by the transducer. Examples of Armstrong-type oscillatory circuits for driving piezoelectric ultrasonic transducers are disclosed by the above-noted U.S. Pat. Nos. 3,432,691; 3,596,206; 3,651,352 and 4,168,447.

Disc-shaped piezoelectric crystal tranducers are relatively lower powered in comparison to tubular-shaped transducers; however, they are less prone to fracture or overheating than the tubular-shaped transducers. Also, disc-shaped piezoelectric crystals are sensitive to applied torque. The capacitance of the transistor significantly changes in response to applied torque and thus results in changes in the resonant frequency of the tank circuit formed by the transducer. Thus, the energizing circuit used to drive the transducer tank circuit must have the capacity to vary the frequency of the driving electrical signal to match the changing resonant frequency of the tank circuit or else the power produced by the transducer will decline. Because of these characteristics of disc-type piezoelectric transducers, they are often used in relatively low power, constant load applications, such as to vibrate a cleaning solution tank used to clean jewelry or contact lenses.

Due to the above-discussed limitations of disc-type piezoelectric crystal transducers, tubular-shaped piezoelectric crystals often are utilized in situations where greater vibrational amptitudes and power levels are required, for instance for vibrating dental work tools, such as plaque and scale removers. One consequence of utilizing a tubular-shaped piezoelectric crystal is that a crystal of that shape has a significant amount of mass so that the crystal itself forms a series RLC circuit in parallel with the tank circuit formed from the transformer coil and the electrodes of the transducer. As a consequence, rather than having a relatively simple LC tank circuit as in the situation of disc-shaped crystals, the equivalent circuit of a tubular-shaped piezoelectric crystal is much more complicated. For tubular shaped piezoelectric transducers, not only must the size of the transformer winding be matched with the capacitance of the crystal as determined by the physical characteristics of the crystal and the electrode layers deposited thereon so that when the resonant or tank circuit is energized, it rings or resonates at its resonant frequency, but also the resonant frequency of the tank circuit must be matched with the resonant frequency of the crystal itself as determined by the crystal's own RLC circuit.

Applicants have found that the values of the inductive and capacitive elements of the series RLC circuit of the piezoelectric crystal varies with the level of torque load applied to the crystal and with the age of the crystal. The capacitive and inductive components of the crystal RLC circuit is caused by the expanding and contracting mass of the crystal. As the crystal ages, applicants believe that the elasticity of the crystal changes so that the inductance and capacitance values of the crystal RLC circuit changes which in turn alters the resonant frequency of the crystal. Thus, although the tank circuit continues to resonate at its resonant frequency, the crystal is no longer being driven at its resonant frequency resulting in a less efficient conversion of electrical energy into mechanical vibrational power.

It is a primary object of the present invention to overcome the short comings of known ultrasonic transducer energizing circuits discussed above. Rather than utilizing an Armstrong-type oscillatory circuit in an attempt to respond or "catch up" to the change in the resonant frequency of the piezoelectric crystal transducer, the energizing circuit of the present invention powers or drives the LC tank circuit at the resonant frequency of the series RLC circuit of the piezoelectric crystal itself. As a consequence, the piezoelectric crystal transducer is always vibrated at its resonant frequency thus resulting in maximum power production despite changes in the characteristics of the piezoelectric crystal caused by application of torque load or aging of the crystal.

DISCLOSURE OF THE INVENTION

The present invention relates to an energizing circuit for automatically driving an ultrasonic transducer, such as a piezoelectric crystal, at its resonant frequency even though the resonant frequency of the transducer varies with loads applied to or aging of the piezoelectric crystal. The energizing circuit includes a resonant or tank circuit for applying an electrical signal of the desired ultrasonic frequency to the transducer which constitutes a capacitive element of the circuit. The inductive element of the resonant circuit is composed of a secondary winding of a three winding transformer which is disposed in parallel with the transducer. The transducer itself also behaves as a series RLC circuit which is connected in parallel with the capacitive and inductive elements of the resonant circuit.

The secondary winding of the transformer is inductively coupled with a primary winding which is energized by a driver circuit. The driver circuit includes a switching circuit composed of cascading power transistors which interconnect the primary winding of the transformer with a direct current power source. The switching circuit is actuated at an ultrasonic frequency corresponding to the resonant frequency of the transducer by a switching signal produced by an oscillator unit of an oscillatory circuit. The frequency of the switching signal produced by the oscillatory circuit is inversely proportional to the voltage level of the control signal received form a control circuit. The control circuit monitors the disparity between a resonant frequency of the transducer and the frequency at which the resonant circuit and the transducer are being driven by the driver circuit and then adjusts the voltage level of the control circuit accordingly.

The control circuit includes a third or feedback winding of the three winding transformer which is inductively coupled with the transformer primary winding. The feedback signal produced by the feedback winding is responsive to the impedance of the resonant circuit which varies with the extent at which the resonant circuit of the transducer differs from its vibrational frequency. The feedback signal of the feedback winding is transmitted to an operational amplifier which adjusts the voltage level of the control signal to reflect the difference between the vibrational frequency of the transducer and its resonant frequency.

In the operation of the energizing circuit of the present invention, if the vibrational frequency of the transducer is below its resonant frequency, for instance when a torque load is applied to the transducer, the voltage across the transformer feedback winding increases from the increase in the impedance of the resonant circuit occurring when the transducer is not vibrating at its resonant frequency. The control circuit senses the increased voltage across the feedback winding and the particular frequency at which the transducer is vibrating and then increases the level of an inverting feedback signal to the operational amplifier relative to the level of a non-inverting signal to thereby cause the amplifier to produce a control signal at a voltage level below that produced when the transducer is vibrating at its resonant frequency. The lower voltage control signal is transmitted to the oscillating unit which in turn increases the frequency of the switching signal which actuates the switching circuit at a faster rate to in turn increase the frequency of the driving signal imposed across the transformer primary winding to thereby increase the vibrational frequency of the transducer to match its resonant frequency.

On the other hand, if the resonant frequency of the transducer is lower than its vibrational frequency occurring, for instance, when the torque load is removed from the transducer, the impedance of the resonant circuit also increases which increases the voltage across the feedback winding. The control circuit senses this increase in the feedback winding voltage and also the vibrational frequency of the transducer and then increases the voltage level of the non-inverting feedback signal transmitted to the operational amplifier relative to the voltage level of the inverting feedback signal to thereby cause the amplifier to produce the control signal at a voltage level above that produced when the transducer is vibrating at its resonant frequency. The higher voltage control signal in turn induces the oscillatory circuit to produce a lower frequency switching signal. This reduced frequency switching signal causes the switching circuit to transmit a lower frequency driving signal to the primary circuit and transformer so that the frequency at which the transducer is driven is reduced to its resonant frequency.

By affirmatively driving the transducer at its resonant frequency, the energizing circuit of the present invention enables the transducer to efficiently convert the high frequency driving signal into ultrasonic vibrations. Thus, the power produced by the transducer is always at a maximum which in turn minimizes the heat built up in the transducer.

BRIEF DESCRIPTION OF THE DRAWINGS

The details of one typical embodiment of the present invention will be described in connection with the accompanying drawings, in which.

BEST MODE OF THE INVENTION

Figure 1:
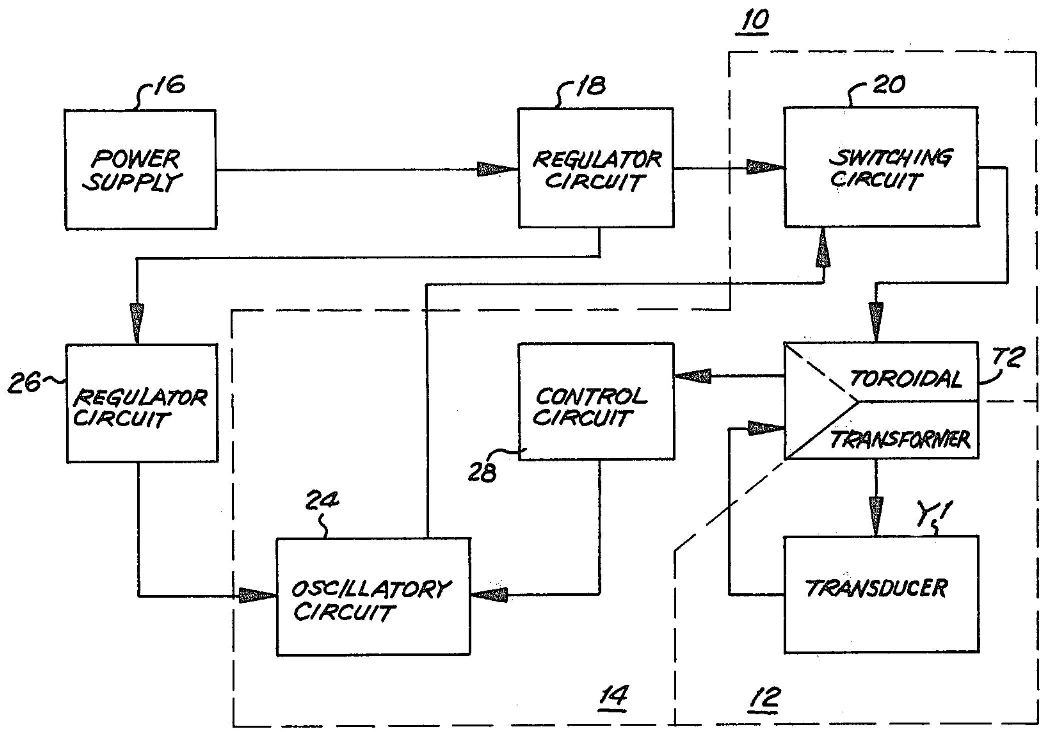
FIG. 1 is a block diagram of the ultrasonic tranducer energizing circuit of the present invention.
Figure 2:
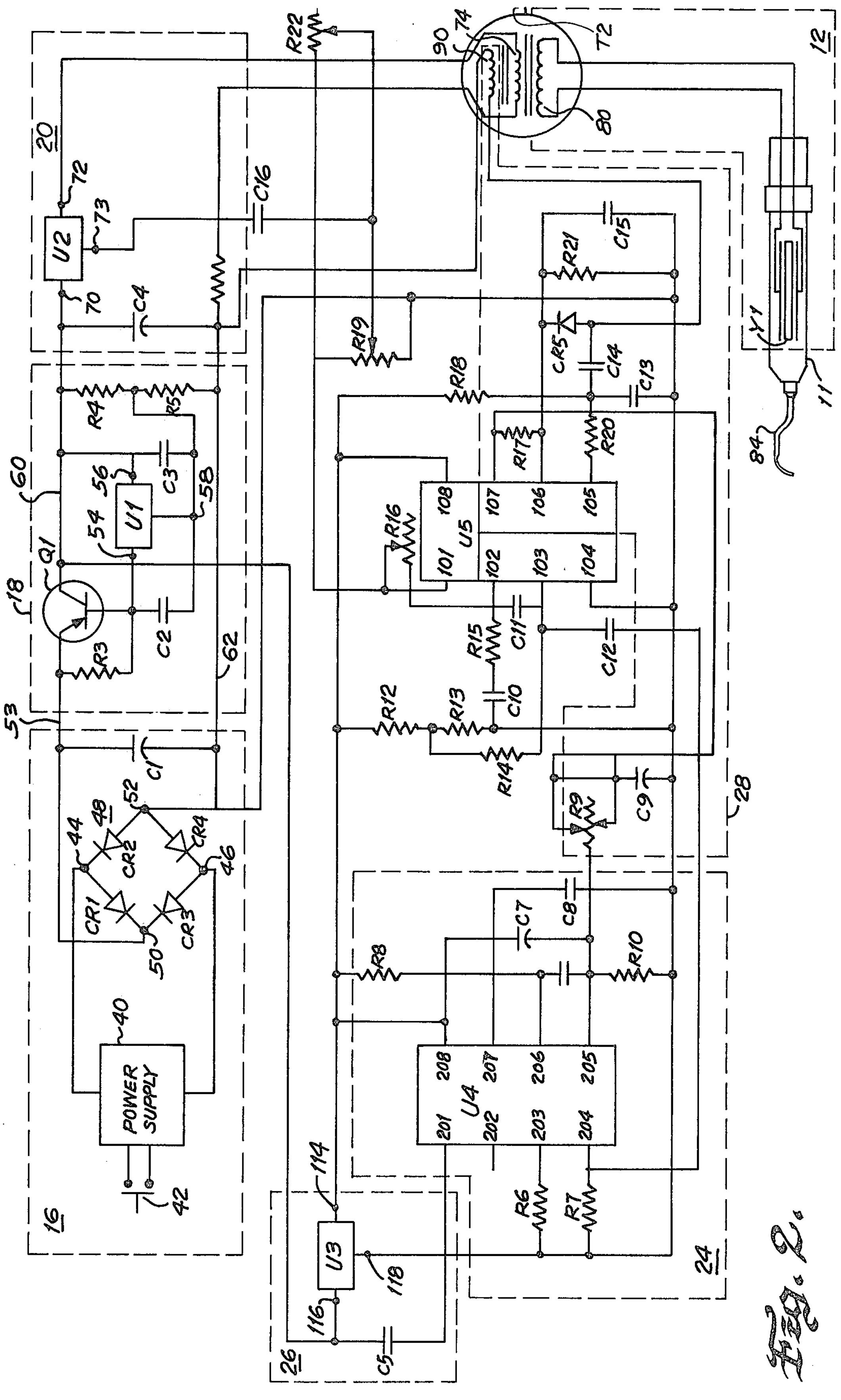
FIG. 2 is a circuit diagram of the ultrasonic transducer energizing circuit of the present invention.

Referring initially to FIG. 1, an energizing circuit 10 is shown in block diagram form for automatically driving an electronic transducer Y1, such as the type used in a dental-handpiece 11, FIG. 2, at its resonant frequency. Circuit 10 includes a resonant circuit 12 for applying an electrical signal of the desired ultrasonic frequency to transducer Y1, with the transducer constituting a capacitive element of the resonant circuit. A driver circuit 14 is interconnected to a power supply circuit 16 and inductively coupled with resonant circuit 12 to drive the resonant circuit at the resonant frequency of transducer Y1. The voltage level of the power supplied by power supply circuit 16 is regulated by a regulator circuit 18. Driver circuit 14 includes a switching circuit 20 which interconnects the regulated power supply from regulator circuit 18 with a three winding transformer T2 which inductively couples the driver circuit with resonant circuit 12. Driver circuit 14 also includes an oscillatory circuit 24 which generates an oscillating switching signal for actuating switching circuit 20. The switching signal produced by oscillatory circuit 24 is amplified by amplifier unit U5 prior to transmittal to switching circuit 20. The input power to oscillatory circuit 22 is provided by a second regulator circuit 26 which receives its input from first regulator circuit 18.

Driver circuit 14 further includes a control circuit 28 which transmits a control signal to oscillatory circuit 24 to control the frequency and the voltage level of the switching signal produced by the oscillatory circuit. Control circuit 28 includes a feedback portion which is coupled to resonant circuit 12 to sense the impedance of the resonant circuit and produce a feedback signal corresponding to the impedance of the resonant circuit. The control circuit 28 transmits a direct current control signal to the oscillatory circuit at a level related to the frequency and peak-to-peak voltage of the feedback signal which in turn is reflective of the difference between the vibrating frequency of transducer Y1 and its resonant frequency. The resonant frequency of the transducer varies with the load imparted on it. By monitoring the frequency and voltage of the feedback signal, control circuit 28 is capable of generating an appropriate control signal level for oscillatory circuit 24 to cause the oscillatory circuit to produce a switching signal to activate switching circuitry 20 at the proper rate to drive transducer Y1 at its resonant frequency.

Additionally referring to the circuit diagram illustrated in FIG. 2, power supply circuit 16 includes a power supply 40 receiving alternating current electrical power from a standard service outlet or other supply, not shown. The power supply is controlled by a foot pedal switch 42 to apply alternating current from the power supply to opposed terminals 44 and 46 of a four-way rectifier bridge 48 composed of four diodes CRl, CR2, CR3, and CR4 interconnected in a well-known manner. The pulsating direct current which appears across voltage output terminal 50 and ground terminal 52 of bridge 48 is filtered by a capacitor C1 and then is applied to voltage regulator circuit 18.

Voltage supply line 53 from terminal 50 of bridge 48 is connected to the emitter of transistor Q1. The base of transistor Q1 is interconnected with voltage supply line 53 through resistor R3. The base of transistor Q1 is also connected to input terminal 54 of an integrated circuit voltage regulator U1. The collector of transistor Q1 is connected with the output terminal 56 of voltage regulator U1. The common or ground terminal 58 of the voltage regulator is connected to the junction of resistors R4 and R5 which are interconnected in series across a rail voltage line 60 leading from the collector of transister Q1 and a ground line 62 leading from bridge terminal 52 to function as a voltage divider. Regulator U1 constantly compares the voltage of the direct current (hereinafter "DC") signal which it outputs at pin 56 with ground at pin 58 so that the output voltage from the regulator remains essentially constant.

In the operation of regulator circuit 18, when the switching circuit increases or decreases the power supply to transformer T2, a change occurs in the differential voltage level between input pin 54 and output pin 56 of regulator U1. An increase in the power supply draws down the voltage level at input pin 24 and vice versa. The change in the voltage level at regulator input pin 54 is felt at the base of transister Q1 which varies the differential voltage existing across the base and emitter of the transistor to in turn alter the output voltage supplied to rail voltage line 60 from the collector of the transistor. For instance, if switching circuit 20 requires more current, the difference in voltage between pins 54 and 56 of U1 decreases which in turn reduces the differential voltage across the base and emitter portions of transistor Q1 causing the transistor to drive harder to thereby maintain a constant voltage level power supply to switching circuit 20.

Regulator circuit 18 permits a very stable voltage level power supply to be transmitted to switching circuit 20 while utilizing a voltage regulator U1 having a capacity less than the voltage level of the power actually supplied to the switching circuit. Regulator U1 is used as a "master" to drive transistor Q1 by controlling the bias supplied to the base of the transistor. Resistors R4 and R5 are relatively sized so that the majority of the current supplied to switching circuit 20 is routed through transistor Q1 rather than through regulator U1.

A capacitor C2 is interconnected between input terminal 54 and ground terminal 58 of regulator U1 to filter or smooth out the cyclically DC output from rectifier bridge 48 to provide regulator U1 with a reasonably constant voltage supply. A capacitor C3 is connected across output pin 56 and ground pin 58 of regulator U1 to minimize drifting of the output voltage at pin 56 especially when the regulator is operating at a no-load condition.

The power supply from regulator circuit 18 is transmitted to the input pin 70 of switching unit U2 of switching circuit 20. The output pin 72 of switching unit U2 is connected to a primary winding 74 of transformer T2 which inductively couples driving circuit 14 with a resonant circuit 12.

Switching unit U2 modulates the power supplied from regulator circuit 18 to transmit a varying driving signal to resonant circuit 12 to induce vibration of tranducer Y1 of hand piece 11. As described more fully below, the frequency and power level of the signal produced by switching unit U2 is controlled by the frequency and intensity of the oscillating control signal oscillatory circuit 24. Preferably switching unit U2 is composed of a Darlington-type power transistor circuit having an emitter connected to input pin 70, a collector connected to output pin 72 and a base connected to base pin 73. A Darlington-type transistor will provide the necessary amplification of the control signal to result in the necessary power gain needed to drive transducer Y1. However, other types of switching devices may be utilized without departing from the scope of the present invention.

Switching circuit 20 also includes a capacitor C4 connected across rail voltage line 60 and ground line 62 to buffer out the ripple or alternating portion of the essentially DC power supply from regulator circuit 18 which occurs when a high level of current is being drawn by transformer T2. Capacitor C4 also prevents ultrasonic signals from transducer Y1, as induced on transformer primary winding 74, from affecting regulator circuit 18.

Resonant circuit 12 is composed of a secondary winding 80 of transformer T2 which is sized to substantially step up the voltage from the level supplied at primary winding 74. Preferably transformer T2 is of a toroidal configuration which provides maximum efficiency and reduced hysteresis losses at high frequency, although other types of transformers may be used, if desired. Secondary winding 80 is connected in series with a transducer Y1 disposed within handpiece 11. Preferably transducer Y1 is of a piezoelectric type rather than of a magnetostrictive type. Piezeoelectric type transducers have a relatively lower temperature Curie point and do not tend to overheat as easily as magnetostrictive transducers.

Transducers, such as transducer Y1, convert high frequency electric energy into mechanical vibrations in the sonic or ultrasonic frequency range. The ultrasonic vibration of transducer Y1 can be applied to a dental work tool, mounted on handpiece 11, such as scaler tool 84 used to remove plaque or scale from teeth. Transducer Y1 behaves as a capacitive element and together with transformer secondary winding 80 forms a tank or resonant circuit 12.

Transducer Y1 most efficiently converts electrical energy into mechanical vibrations when driven at its resonant frequency. As a consequence, when transducer Y1 is vibrating at its resonant frequency, the impedance in resonant circuit 12 is at a minimum. The resonant frequency of transducer element 82 varies with the torque level applied to the transducer element, for instance, when scaler tool 84 is pressed against an object, e.g. a tooth. As the vibrational frequency of transducer Y1 varies from its resonant frequency, the conversion of electrical energy to mechanical vibrations occurs in a much less efficient manner, causing the power produced by the transducer to drop off and the transducer to generate more heat. One method of bringing the transducer power back up to an acceptable level is to increase the level of electrical power applied to the transducer. However, this produces further undesirable heating of the transducer. Rather than attempting to simply increase the power applied to transducer Y1, driver circuit 14 of the present invention adjusts the frequency of the electrical signal applied to resonant circuit 12 to match the current resonant frequency of transducer Y1 thereby continually exciting the transducer at a rate corresponding to its resonant frequency.

Driver circuit 14 includes a control circuit 28 which senses the difference between the vibrating frequency of transducer Y1 and its resonant frequency and then produces a corresponding control signal which is transmitted to oscillatory circuit 24. Oscillating circuit 24 in turn produces an oscillating switching signal which is transmitted to switching unit U2 to properly modulate the power supply from regulator circuit 18 so that the driving signal applied to resonant circuit 12 in fact drives transducer Y1 at its resonant frequency. Control circuit 28 includes a feedback winding 90 which is inductively coupled with primary winding 74 of transformer T2 to sense the dynamic impedance changes in resonant circuit 12 caused by load or torque being applied to transducer Y1. Feedback winding 90 constitutes the third winding of toroidal type transformer T2. Feedback winding 90 is connected to ground line 62 and to control circuit 28 of driving circuit 14. Feedback winding 90 produces a feedback signal having a voltage and frequency reflective of the impedance of resonant circuit 12.

The feedback signal induced in winding 90 is transmitted to operational amplifier U5 of control circuit 28. Preferably amplifier U5 is of an integrated dual type for amplifying the feedback signal from winding 90 and for amplifying the switching signal produced by the oscillatory circuit 24, as discussed more fully below. Amplifier U5 includes a single voltage input pin 108 and a single ground pin 104. On one side, amplifier U5 includes a noninverting input pin 105 and an inverting input pin 106 operably connected to a first output 107. On the opposite side, amplifier U5 includes a noninverting input pin 103 and an inverting input pin 102 operably connected to a second output pin 101. It is to be understood that rather than utilizing a dual type amplifier U5, amplifier U5 may be replaced with two individual amplifiers.

Pin 104 of amplifier U5 is connected to ground line 110 which in turn is connected to ground pin 52 of rectifier diode bridge 48. Voltage input pin 108 of amplifier U5 is connected to the output terminal 114 of a voltage regulator unit U3 of a regulator circuit 26, which regulator unit supplies a substantially constant DC voltage signal to amplifier U5. The input terminal 116 of voltage regulator U3 is connected to the output or collector side of transistor Q1 of regulator circuit 18, and the ground terminal 118 of regulator circuit U3 is connected to ground line 62. Preferably regulator unit U3 is similar in construction and operation to regulator unit U1 in that regulator U3 constantly compares the voltage of the DC signal it outputs at pin 114 with ground at pin 118 so that the output voltage remains essentially constant, for instance at approximately 12 volts. A capacitor C5 is connected across input pin 116 and ground pin 118 of voltage regulator U3 to filter or smooth out ripples in the input signal received from transistor Q1. It will be appreciated that interconnecting voltage regulator U3 in tanden with the regulated output of regulator circuit 18 enhances the stability of the output signal produced by regulator U3.

The inverting and noninverting input pins 106 and 105, respectively, of amplifier U5 are interconnected with feedback winding 90 to utilize amplifier U5 to produce an output signal at pin 107 related to the impedance level of resonant circuit 12 which in turn is indicative of the difference between the vibrating frequency of transducer Y1 and its resonant frequency. The feedback signal from feedback winding 90 is transmitted to the inverting input pin 106 of operational amplifier U5 through rectifying diode CR5 which only permits passage of the positive half of the oscillating feedback signal. Resistor R21 and capacitor C15, disposed in parallel to each other, are interconnected between ground line 62 and the inverting input pin 106 of amplifier U5.

The feedback signal from feedback winding 90 is also transmitted to noninverting input pin 105 of amplifier U5 through resistor R20 which in turn is interconnected to the junction of capacitors C13 and C14 which act as a voltage divider at the relatively high frequencies of the feedback signal, in the range of 20,000 to 26,000 cycles per second. Capacitor C13, tied to ground line 62, is connected in series with capacitor C14 tied to feedback winding 90. Capacitors C13 and C14 are used to divide the voltage level of the signal received from feedback winding 90 to compensate for the fact that diode CR5 cuts off the negative half of the signal from feedback winding 90 thereby effectively reducing in half the voltage of the feedback signal. By utilizing C13 and C14 as a voltage divider, the signal inputted at pin 105 of amplifier U5 can properly be used as a comparison signal with the signal inputted at pin 106.

Because feedback winding 90 is inductively coupled to primary winding 74 of transformer T2 which in turn is inductively coupled to secondary winding 80, the feedback signal from winding 90 is of an alternating current type which reflects the nature of the dynamic characteristics of resonant circuit 12. Thus, the form of the signal inputted at noninverting pin 105 of amplifier U5 is similar to the nature of the feedback signal, e.g. an alternating current signal. Rectifying diode CR5 and capacitor C15 together rectify the alternating current signal from feedback winding 90 into a pulsing DC signal which is then applied to inverting input pin 106 of amplifier U5. The DC component of the signal inputted at pin 106 is enhanced by the leakage of current through diode CR5, as commonly occurs when rectifying diodes are subjected to relatively high frequency signals. Resistor R21, connected in parallel with capacitor C15, assists capacitor C15 to bleed off faster than it normally would. Because of the rather large DC component of the input signal imposed on inverting pin 106, the output signal from outpin 107 of amplifier U5 is generally in the form of a DC signal with an alternating current ripple.

Capacitors C13, C14 and C15 are sized to alter the relative levels of the input signals at pins 105 and 106 in response to changes in both the voltage and frequency of the feedback signal. When transducer Y1 is vibrating at its resonant frequency, a minimum impedance exists in resonant circuit 12. If a torque load is applied to transducer element 22 by, for instance, pressing scaler tip 84 against a tooth, the resonant frequency of the transducer increases. This is an inherant characteristic of piezoelectric crystal type transducers. As a consequence, a disparity exists between the resonant frequency of circuit 20 and the frequency which it is being driven at by driver circuit 14. This causes a change in impedance in resonant circuit 12 as reflected by reduction in the efficiency with which transducer Y1 converts electrical energy into mechanical vibrations which in turn results in a reduction of power produced by the transducer. The increase in impedance in resonant circuit 12 causes a corresponding increase in the voltage across secondary, primary and feedback windings 80, 74 and 90, respectively, of transformer T2. This increase in voltage on feedback winding 90 results in a greater voltage increase in the signal supplied to inverting input pin 106 relative to the voltage increase in the signal supplied on noninverting input pin 105 of amplifier U5. This disparity between the voltage increases in the inverting and noninverting signals is due to the relative sizes of capacitors C13, C14 and C15 and causes U5 to output a reduced voltage control signal from pin 107. As explained more fully below, the lower voltage control signal induces oscillatory circuit 24 to actuate switching unit U2 at a faster rate to thereby increase the frequency of the driving signal imposed on primary winding 74 which in turn increases the frequency with which transducer Y1 is driven to match the higher resonant frequency of the transducer caused by application of the torque load on the transducer.

When the torque load is subsequently removed from transducer Y1, the resonant frequency of the transducer will decrease. The resulting disparity between the transducer resonant frequency and the frequency at which resonant circuit 12 is being driven produces an increase in the impedance of the resonant circuit in turn again resulting in an increase in the voltage on feedback winding 90 of transformer T2. However, as opposed to the result when torque was initially applied to transducer Y1, the increase in voltage on feedback winding 90 caused by the removal of torque from the transducer results in a larger relative increase in the voltage of the noninverting input signal relative to the increase in voltage of the inverting input signal. This results from the smaller size of capacitor C15 relative to capacitors C13 and C14 which does not permit capacitor C15 to respond fast enough to track exactly the feedback signal which is now of a higher frequency than when the torque load was initially applied to the transducer. As a consequence, the reactance of capacitor C15 drops so that the rise in voltage of the signal at inverting input pin 106 is not as great as the relative increase in voltage of the feedback signal. The larger sizes of capacitors C13 and C14 do not hinder their ability to respond to the increase in frequency of the feed back signal.

The larger increase in the voltage of noninverting input signal relative to the increase in voltage of the inverting input signal produced by the removal of torque load on transducer Y1 causes an increase in the voltage level of the control signal at pin 107 until it again reaches the level corresponding to the resonant frequency of transducer Y1 when no load is being applied to the transducer.

The gain level for amplifier U5 is set by resistor R20 connected to noninverting input terminal 105 and by resistor R17 interconnected between inverting input pin 106 and output pin 107. The bias for amplifier U5 is set by resistor R18 interconnected between resistor R20 and input voltage pin 108 of the amplifier.

The control signal from pin 107 of amplifier U5 is transmitted through variable resistor R9 to the modulation input pin 205 of oscillator unit U4 of oscillator circuit 24. In preferred form, oscillator unit U4 is an intergrated circuit oscillating signal generator which produces a triangular, oscillating, switching signal at output pin 204 at a frequency inversely related to the voltage level of the signal at modulation input pin 205. Ground pin 201 of oscillator unit U4 is connected to the ground terminal 118 of regulator unit U3; and voltage input pin 208 is connected to voltage output pin 114 of the regulator unit.

Modulation input pin 205 of oscillator unit U4 is connected to voltage input pin 208 through capacitor C7 and is connected to ground line 62 through resistor R10 so that when oscillatory circuit 24 is energized, the side of capacitor C7 which is connected to modulation input pin 205 charges towards ground, thereby increasing the frequency of the triangular wave switching signal produced at output pin 204. However, the positive voltage control signal from pin 107 of amplifier U5 tends to counteract or oppose the ability of capacitor C7 to charge toward ground, thereby increasing the voltage of the control signal at modulation input pin 205 which in turn decreases the frequency of the switching wave signal at pin 204.

Oscillatory circuit 24 also includes a capacitor C8 interconnected between timing capacitor pin 207 of oscillator unit U4 and ground line 62. Capacitor C8 sets the general frequency level of the switching signal outputted at pin 204. For piezoelectric transducers used in typical dental handpieces, capacitor C8 may be sized so that the median or center frequency of the switching signal produced by oscillator unit U4 is in the range of, for example, 20,000 to 23,000 cycles per second. The frequency level of the switching signal is also set by the size of resistor R8 interconnected between timing resistor pin 206 and voltage output pin 114 of regulator U3.

Resistor R6, connected between ground line 62 and square wave output pin 203; and resistor R7, connected between ground line 62 and triangular wave output pin 204, place a constant load on these pins to prevent the oscillator from being affected by static changes or other extraneous signals which might otherwise be imposed on these pins.

Variable resistor R9, tied to modulation input pin 205 of oscillator unit U4 as discussed above, serves as a sensitivity control for the oscillator unit. Resistor R9 attenuates the control signal transmitted from amplifier U5 when an aberrant load is applied to resonant circuit 12, such as when tool 84 is tapped against an object causing transducer Y1 to react strongly. The reaction of the transducer is picked up by feedback winding 90 then transmitted through amplifier U5 to resistor R9. Capacitor C9, tied between resistor R9 and ground line 62, also assists in smoothing out or attenuating erratic signals produced by resonant circuit 12.

The alternating switching signal from pin 204 of oscillator unit U4 is transmitted through capacitor C12 to noninverting input pin 103 of the second side of dual operation amplifier U5. Capacitor C12 functions to eliminate the DC component of the triangular oscillating control signal produced at pin 204. The output from oscillator unit U4 is also transmitted to inverting input pin 102 of amplifier U5 through capacitor C12, through current limiting resistor R14, a voltage divider circuit formed by resistors R12 and R13, capacitor C10 and resistor R15. Resistors R12 and R13 are in series with each other across the voltage rail from regulator U3 and ground line 62 to add a DC component to the inverting signal. Capacitor C10 and resistor R15 function to provide bias for amplifier U5 and to round the corners of the triangular waveform switching signal produced by oscillator unit U4. Capacitor C1l, tied between input signal pins 102 and 103 of amplifier U5, also functions to round the triangular waveform signal generated by oscillator U4. Variable resistor R16, connected between inverting signal input pin 102 and output pin 101 of amplifier U5 sets the gain level for the amplifier.

Amplifier U5 shapes and amplifies the switching signal produced by oscillator unit U4 to a level sufficient to actuate switching circuit 20. The switching signal from pin 101 of amplifier U5 is transmitted through variable resistors R19 and R22, disposed in parallel to each other, and then through capacitor C16 to the base of switching unit transistor U2 of switching circuit 20. Resistors R19 and R22 may be adjusted to set the minimum and maximum current levels of the switching signal. Preferably resistor R22 is located so that it is easily manually adjustable by the dental tool operator while R19 is disposed within the cabinetry, not shown, housing energizing circuit 10. The minimum current level of the switching signal unit is established by adjusting resistor R22 to its maximum resistance level and then adjusting resistor R19 to achieve the maximum desired impedance produced by resistors R19 and R22. The maximum current level of the switching signal is established by setting variable resistor R22 at its minimum resistance level so that it effectively operates as a short circuit and then adjusting variable resistor 16 to thereby set the maximum gain level of amplifier U5 which dictates the maximum current available to drive transistor U2, which in turn dictates the maximum power transmitted to transformer primary winding 74.

In the operation of energizing circuit 10, when switch 42 is initially closed and transducer Y1 is not subject to any load, capacitor C7 accumulates a charge thereby driving the voltage level at modulation input pin 205 of oscillator unit U4 toward ground. As the voltage level at pin 5 diminishes toward ground, the frequency of the switching signal outputted at pin 204 of U4 increases thereby causing switching unit U2 to switch on and off at an increasing rate to increase the frequency at which transducer Y1 is driven. Although a feedback signal, reflective of the impedance in resonant circuit 12, is being felt on feedback winding 90, and the feedback signal is being transmitted to amplifier U5, no appreciable control signal is being produced at output pin 107 since at frequencies below the resonant frequency of transducer Y1, the inverting and noninverting input signals at pins 106 and 105 of U5 are essentially of the same magnitude. As a consequence, no control signal is produced to conteract the lowering of the voltage level of the input signal at pin 205 of U4. When the frequency at which Y1 is being driven reaches its resonant frequency, the impedance in resonant circuit 12 reaches a minimum which in turn causes a drop in the voltage of the feedback signal. This drop in the feedback signal voltage combined with the changes in the reactance of capacitors C13, C14 and C15 due to the increase in frequency range of the feedback signal results in a relatively rapid rise in the voltage at noninverting signal input pin 105 of U5. This causes a sudden rise in the voltage of the control signal produced at pin 107 of U5. The control signal in turn arrests or suppresses a further charging of capacitor C7 thereby stabilizing the level of the contol signal imposed on input pin 205 of U4. As a consequence, the frequency of the switching signal produced by U4 does not increase above the resonant frequency of transducer Y1.

When a torque load is applied to transducer Y1, for instance when scaler tool 84 is pressed against a tooth, the resonant frequency of the transducer increases. The disparity between the new resonant frequency of the transducer and the frequency at which it is being driven reduces the efficiency with which the transducer converts electrical energy into the mechanical vibrations and the impedance of resonant circuit 12 increases. As a result, the voltages across secondary, primary and feedback windings 80, 74 and 90, respectively, increase. As discussed above, the increase in the voltage of the feedback signal causes the voltage of the inverting signal applied to pin 106 of U5 to increase by a larger amount than the voltage increase at noninverting input signal pin 105. Consequently, the voltage of the control signal produced at pin 107 decreases thereby reducing the ability of the control signal to counteract the tendency of capacitor C7 to charge toward ground. As a result, the voltage of the control signal actually reaching modulating input pin 205 of oscillator unit U4 is decreased which causes the oscillator in U4 to increase the frequency of the switching signal produced at pin 204 which in turn increases the frequency at which transducer Y1 is driven at until the driving frequency matches the new, higher resonant frequency of the loaded transducer.

Subsequently when scaler tool 84 is no longer pressed against a tooth so that the torque load on tranducer Y1 is removed, the resonant frequency of the transducer drops back down to its nominal or no-load resonant frequency. At that time, transducer Y1 is being driven at a higher frequency than its resonant frequency and thus the impedance in resonant circuit 12 again rises causing a corresponding rise in the feedback signal produced by feedback winding 90 of transformer T2. The increased voltage feedback signal, as discussed above, produces a larger increase in the voltage level at noninverting input signal pin 105 than the voltage increase at inverting input signal pin 106. As a consequence, the voltage level of the control signal produced at pin 107 is increased which in turn increases the capacity of the control signal to react against the tendency of capacitor C7 to charge toward ground which in turn results in a higher voltage level control signal being transmitted to input pin 205 of oscillator unit U4. The increase in voltage of the control signal results in a decrease in the frequency of the switching signal produced by oscillator U4 which in turn reduces the frequency of the driving signal produced by switching at U2 which in turn reduces the vibrational frequency of transducer Y1. When the vibrational frequency of the transducer again coincides with its resonant frequency, the impedance in resonant circuit 12 again lowers to a minimum level which in turn reduces the voltage level of the feedback signal produced by feedback winding 90. The reduced voltage feedback signal when applied to inverting and noninverting input pins 106 and 105 causes the control signal produced at pin 107 to stabilize at the voltage level coinciding with the resonant frequency of transducer Y1.

As will be apparent to those skilled in the art to which the invention is addressed, the present invention may be embodied in forms and embodiments other than those specifically disclosed above, without departing from the spirit or essential characteristics of the invention. The particular embodiment of energizing circuit 10, described above, is therefore to be considered in all respects as illustrative and not restrictive, i.e. the scope of the present invention is as set forth in the appended claims rather than being limited to the example of energizing circuit 10 as set forth in the foregoing description.

What is claimed is:

1. An energizing system for automatically driving an electronic transducer at its resonant frequency, comprising:

(a) resonant circuit means for applying an electrical signal of the desired frequency to the transducer, the transducer constituting a capacititve element of said resonant circuit means; and (b) driver circuit means operably associated with said resonant circuit means, comprising:

control circuit means responsive to the magnitude and the frequency of the electrical signal applied to said transducer for producing a control signal at a level related to the difference between the vibrating frequency of the transducer and its resonant frequency;

oscillatory circuit means operably coupled with said control circuit means for producing an oscillating switching signal at the resonant frequency of said transducer in response to the level of the control signal; and switching circuit means connected between a power supply and said resonant circuit means, said switching circuit means actuated by said switching signal to modulate said power supply to drive said resonant circuit means at the resonant frequency of the transducer.

2. The energizing system according to claim 1, wherein said transducer is a piezoelectric type transducer.

3. The energizing system according to claim 1, wherein said control circuit means produces the control signal at a level related to the impedance of said resonant circuit means.

4. The energizing system according to claim 2 or 3, wherein said control circuit means:

includes feedback means coupled with said resonant circuit means for sensing the impedance of said resonant circuit means and producing a feedback signal related thereto; and produces the control signal at a value related to the value of the feedback signal.

5. The energizing system according to claim 4, wherein said control signal comprises a DC signal related to the frequency and voltage of the feedback signal.

6. The energizing system according to claim 4, wherein said oscillatory circuit means includes a signal generator for generating said oscillating switching signal at the resonant frequency of the transducer as determined by the voltage level of the control signal.

7. The energizing system according to claim 2, wherein said control circuit produces the control signal at a level dependent upon both the difference between the voltage level of the feedback signal and the minimum voltage level of the feedback signal occurring when the transducer is being driven at its resonant frequency, and the difference between the oscillating frequency of the feedback signal and the frequency of the feedback signal when the transducer is vibrating at its resonant frequency under a no-load condition.

8. The energizing system according to claim 7, wherein said control circuit includes an operational amplifier utilizing an inverting and noninverting signal inputs, and divider circuit means for receiving the feedback signal from the feedback circuit and converting it into inverting and noninverting input signals for the operational amplifier, said divider circuit means altering the relative values of the inverting and noninverting signals depending on both the frequency and voltage of the feedback signal.

9. The energizing system according to claim 7, wherein said control circuit includes means for preventing the control circuit from producing control signals corresponding to harmonic frequencies of the transducer occuring below the resonant frequency of the transducer.

10. The energizing system according to claim 4, further comprising a three winding transformer inductively coupling said resonant circuit means with said driving circuit means, a first winding of said transformer constituting an inductive element of said resonant circuit means, a second winding of said transformer connected in series with said switching circuit means for energizing said transformer and a third winding of said transformer forming part of said control circuit feedback means

11. The energizing system according to claim 1, further comprising an amplifier for amplifying the control signal prior to reception by said switching circuit means.

12. The energizing system according to claim 11, further comprising means for selectively limiting the maximum and minimum levels of said amplified control signal.

13. The energizing system according to claim 1, further comprising a first voltage regulator means interposed between the power supply and said switching circuit means for supplying a substantially constant voltage level power supply to said switching circuit means.

14. The energizing system according to claim 13, further comprising a second voltage regulator connected in series with said first voltage regulator for supplying a substantially constant level, stable input voltage signal to said oscillatory circuit means.

15. An energizing system for automatically driving an electronic transducer at its resonant frequency, comprising:

resonant circuit means for applying an electrical signal of a desired frequency to the transducer, the transducer having electrodes constituting a capacitive element of said resonant circuit and a secondary winding of a transformer constituting an inductive element of said resonant circuit, and the transducer itself acting as a series RLC circuit disposed in parallel with the capacitive and inductive elements of the resonant circuit means; and driver circuit means inductively coupled with said resonant circuit means for driving said resonant circuit means at the resonant frequency of the transducer, said driver circuit comprising:

an inductive element coupled with said transformer secondary winding comprising the primary winding of said transformer;

switching circuit means connected between a power supply and said transformer primary winding;

control circuit means responsive to the magnitude and frequency of the electrical signal applied to said transducer for monitoring the impedance of said resonant circuit means and producing a control signal related to the difference between the impedance of said resonant circuit means and the minimum impedance of said resonant circuit means occurring when the transducer is vibrating at its resonant frequency; and oscillatory circuit means operably coupled with said control circuit means and said switching circuit means, said oscillatory circuit means producing an oscillating switching signal in response to said control signal to actuate said switching circuit means to supply a driving signal to said transformer primary winding at the resonant frequency of the transducer.

16. The energizing system according to claim 15, wherein said control circuit means comprises:

a feedback winding inductively coupled with said transformer primary winding for sensing the impedance of said resonant circuit means; and an operational amplifier utilizing inverting and noninverting input signals and producing the control signal in response to the levels of the input signals; and circuit means for transforming the feedback signal produced by the feedback winding into inverting and noninverting signals for the operational amplifier to cause the operational amplifier to produce a control signal at a value corresponding to the difference between the vibrating frequency of the transducer and its resonant frequency.

17. The energizing system according to claim 16, wherein said circuit means for receiving the feedback signal from the feedback winding and converting it into inverting and noninverting input signals for the operational amplifier includes a divider circuit for altering the relative levels of the inverting and noninverting input signals based on both the frequency and voltage level of the feedback signal.

18. The energizing system according to claim 16 or 17, wherein said circuit means for receiving the feedback signal from the feedback winding and converting it into inverting and noninverting input signals for the operational amplifier includes means for preventing said control circuit from producing control signals corresponding to harmonic frequencies of the transducer occurring below the resonant frequency of the transducer.

19. The energizing system according to claim 15, wherein the transducer is of a piezoelectric type.

* * * * *

UNITED STATES PATENT AND TRADEMARK OFFICE

CERTIFICATE OF CORRECTION

PATENT NO. : 4,445,063

DATED : April 24, 1984

INVENTOR(S) : Robert J. Smith

It is certified that error appears in the above-identified patent and that said Letters Patent is hereby corrected as shown below:

Column 1, line 59: "Which" should be --which--
Column 2, line 24: "amptitudes" should be --amplitudes--
Column 3, line 37: "form" should be --from--
Column 5, line 64: "transister" should be --transistor--
Column 6, line 34 & 35: "tranducer" should be --transducer--
line 35: "hand piece" should be --handpiece--
Column 8, line 67: "e.g." should be --e.g.,--
Column 9, line 12: "outpin" should be --output pin--
line 23: "inherant" should be --inherent--
line 45: "contro1" should be --control--
Column 10, line 8: "feed back" should be --feedback--
line 27: "intergrated" should be --integrated--
Column 11, line 2: insert --,-- after "U4"
line 29: "C1l" should be --C11--
Column 12, line 10: "conteract" should be --counteract--
line 24: "contol" should be --control--
line 55: "tranducer" should be --transducer--
Column 13, line 24: delete --,-- after "above"
line 27: insert --,-- after "i.e."
line 39: "capacititve" should be --capacitive--
Column 14, line 40: "occuring" should be --occurring--

Signed and Sealed this

*Second* Day of *October 1984*

[SEAL]

*Attest:*

GERALD J. MOSSINGHOFF

*Attesting Officer* *Commissioner of Patents and Trademarks*